US012784975B2

(12) United States Patent
Kitagawa et al.

(10) Patent No.: US 12,784,975 B2
(45) Date of Patent: Nov. 3, 2026

(54) MULTILAYER CERAMIC CAPACITOR AND MOUNTING STRUCTURE FOR MULTILAYER CERAMIC, THE MOUNTING STRUCTURE INCLUDING SUBSTANTIALLY H-SHAPED PILLARS

(71) Applicant: Murata Manufacturing Co., Ltd., Nagaokakyo (JP)

(72) Inventors: Tomoki Kitagawa, Nagaokakyo (JP); Tatsunori Yasuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 241 days.

(21) Appl. No.: 18/625,326

(22) Filed: Apr. 3, 2024

(65) Prior Publication Data

US 2024/0266109 A1 Aug. 8, 2024

Related U.S. Application Data

(63) Continuation of application No. PCT/JP2023/020536, filed on Jun. 1, 2023.

(30) Foreign Application Priority Data

Sep. 15, 2022 (JP) ................................. 2022-147347

(51) Int. Cl.
*H01G 2/06* (2006.01)
*H01G 4/232* (2006.01)
*H01G 4/30* (2006.01)

(52) U.S. Cl.
CPC ............. *H01G 2/065* (2013.01); *H01G 4/232* (2013.01); *H01G 4/30* (2013.01); *H05K 2201/10378* (2013.01)

(58) Field of Classification Search
CPC ........... H01G 4/30; H01G 4/232; H01G 2/065
See application file for complete search history.

(56) References Cited

U.S. PATENT DOCUMENTS 5,135,606 A 8/1992 Kato et al.
2016/0093439 A1 3/2016 Fujita et al.
(Continued)

FOREIGN PATENT DOCUMENTS

JP H03283374 A 12/1991
JP 2016072603 A 5/2016
JP 2020047908 A 3/2020

OTHER PUBLICATIONS

International Search Report in PCT/JP2023/020536, mailed Aug. 29, 2023, 3 pages.
(Continued)

*Primary Examiner* — Eric W Thomas
(74) *Attorney, Agent, or Firm* — Keating & Bennett, LLP

(57) ABSTRACT

A multilayer ceramic capacitor includes a capacitor body and an interposer. The capacitor body includes first and second external electrodes. The interposer includes an interposer body and first and second pillars. The interposer body includes an interposer-body first main surface adjacent to the capacitor body, an opposite interposer-body second main surface, and first and second through holes. The first and second pillars each include a metal with a melting point of about 230° C. or higher as a main component, provided in the respective first and second through holes, and conductively connected to the respective first and second external electrodes. The first and second pillars protrude from at least one of the interposer-body first and second main surfaces.

12 Claims, 7 Drawing Sheets

(56) References Cited

U.S. PATENT DOCUMENTS

| | | | | |
|---|---|---|---|---|
| 2016/0372265 | A1* | 12/2016 | Hattori | H01G 2/065 |
| 2017/0290161 | A1* | 10/2017 | Shimura | H01G 4/40 |
| 2020/0090870 | A1 | 3/2020 | Kim et al. | |
| 2020/0118743 | A1* | 4/2020 | Byun | H01G 4/005 |
| 2020/0343044 | A1* | 10/2020 | Bae | H01G 4/12 |

OTHER PUBLICATIONS

Written Opinion in PCT/JP2023/020536, mailed Aug. 29, 2023, 4 pages.

* cited by examiner

MULTILAYER CERAMIC CAPACITOR AND MOUNTING STRUCTURE FOR MULTILAYER CERAMIC, THE MOUNTING STRUCTURE INCLUDING SUBSTANTIALLY H-SHAPED PILLARS

CROSS REFERENCE TO RELATED APPLICATIONS

This application claims the benefit of priority to Japanese Patent Application No. 2022-147347 filed on Sep. 15, 2022 and is a Continuation Application of PCT Application No. PCT/JP2023/020536 filed on Jun. 1, 2023. The entire contents of each application are hereby incorporated herein by reference.

BACKGROUND OF THE INVENTION

1. Field of the Invention

The present invention relates to multilayer ceramic capacitors and mounting structures for multilayer ceramic capacitors.

2. Description of the Related Art

Recently, there has been a demand for large-capacitance and small-sized multilayer ceramic capacitors. Such a multilayer ceramic capacitor includes an inner layer portion in which dielectric layers made of a ferroelectric material having a relatively high permittivity and internal electrode layers are alternately laminated. Additional dielectric layers serving as outer layer portions are disposed on the top and bottom sides of the inner layer portion, thus forming a multilayer main body having a rectangular parallelepiped shape. Side gap portions are provided on both side surfaces of the multilayer main body in the width direction, thus forming a multilayer body. Furthermore, external electrodes are provided on both end surfaces of the multilayer body in the longitudinal direction, thus forming a capacitor body.

Since the dielectric layer is piezoelectric and electrostrictive, it experiences stress and mechanical strain when an electric field is applied. The stress and the mechanical strain are transmitted as vibration to a board with the multilayer ceramic capacitor mounted thereon. Consequently, the entire board acts as an acoustic reflection surface, such that a vibrant sound that causes a noise, i.e., the so-called "acoustic noise" is generated. In order to prevent or reduce the generation of the "acoustic noise", a known multilayer ceramic capacitor includes an interposer disposed adjacent to a surface of the capacitor body and faces a board to which the multilayer ceramic capacitor is mounted (see, for example, Japanese Unexamined Patent Application, Publication No. 2020-47908).

The interposer disclosed in Japanese Unexamined Patent Application, Publication No. 2020-47908 involves a possibility that liquid solder spreads upward and wets a longitudinal end surface of the multilayer body. When the liquid solder spreads upward and wets the end surface of the multilayer body to an excessive extent, the vibration of the capacitor body tends to be transmitted to the board, and the "acoustic noise" may not be sufficiently prevented or reduced.

SUMMARY OF THE INVENTION

Example embodiments of the present invention provide multilayer ceramic capacitors each including an interposer and mounting structures for multilayer ceramic capacitors that are each able to reduce or prevent "acoustic noise".

An example embodiment of the present invention is directed to a multilayer ceramic capacitor including a capacitor body including a multilayer body in which dielectric layers and internal electrode layers are alternately laminated, a first external electrode, and a second external electrode, and an interposer adjacent to one surface of the capacitor body, the one surface facing in a lamination direction. The multilayer body includes a multilayer-body first main surface and a multilayer-body second main surface opposed to each other in the lamination direction, a multilayer-body first end surface and a multilayer-body second end surface that are opposite to each other in a length direction orthogonal or substantially orthogonal to the lamination direction, and a multilayer-body first side surface and a multilayer-body second side surface that are opposite to each other in a width direction orthogonal or substantially orthogonal to both the lamination direction and the length direction. The first external electrode is provided on the multilayer-body first end surface, and the second external electrode is provided on the multilayer-body second end surface. The interposer includes an interposer body, a first pillar, and a second pillar. The interposer body includes an interposer-body first main surface that faces the capacitor body, an interposer-body second main surface that is opposite to the interposer-body first main surface, and a first through hole and a second through hole that penetrate through the interposer body from the interposer-body first main surface to the interposer-body second main surface. The first pillar includes a metal material including a metal with a melting point of about 230° C. or higher as a main component, and is provided in the first through hole and conductively connected to the first external electrode. The second pillar includes a metal material including a metal with a melting point of about 230° C. or higher as a main component, and is provided in the second through hole and conductively connected to the second external electrode. The first pillar and the second pillar protrude from at least one of the interposer-body first main surface or the interposer-body second main surface.

An example embodiment of the present invention is directed to a mounting structure for a multilayer ceramic capacitor, the mounting structure including the multilayer ceramic capacitor according to an example embodiment of the present invention described above, and a mounting board including a first land and a second land. The mounting board is positioned such that the interposer is sandwiched between the mounting board and the capacitor body, the first land is conductively connected to the first pillar, and the second land being conductively connected to the second pillar.

The multilayer ceramic capacitors each including the interposer and the mounting structures for multilayer ceramic capacitors according to example embodiments of the present invention are each able to reduce or prevent "acoustic noise".

The above and other elements, features, steps, characteristics and advantages of the present invention will become more apparent from the following detailed description of the example embodiments with reference to the attached drawings.

BRIEF DESCRIPTION OF THE DRAWINGS

FIG. 6A is a plan view of an interposer-body first main surface, FIG. 6B is a plan view of an interposer-body second main surface, FIG. 6C is a cross-sectional view of the interposer taken along the line A in FIG. 6A, and FIG. 6D is a cross-sectional view of the interposer taken along the line B in FIG. 6A.

FIG. 7A is a plan view of an interposer-body first main surface, FIG. 7B is a plan view of an interposer-body second main surface, FIG. 7C is a cross-sectional view of the interposer taken along the line A in FIG. 7A, and FIG. 7D is a cross-sectional view of the interposer taken along the line B in FIG. 7A.

DETAILED DESCRIPTION OF THE EXAMPLE EMBODIMENTS

Example embodiments of the present invention will be described in detail below with reference to the drawings.

Figure 1:
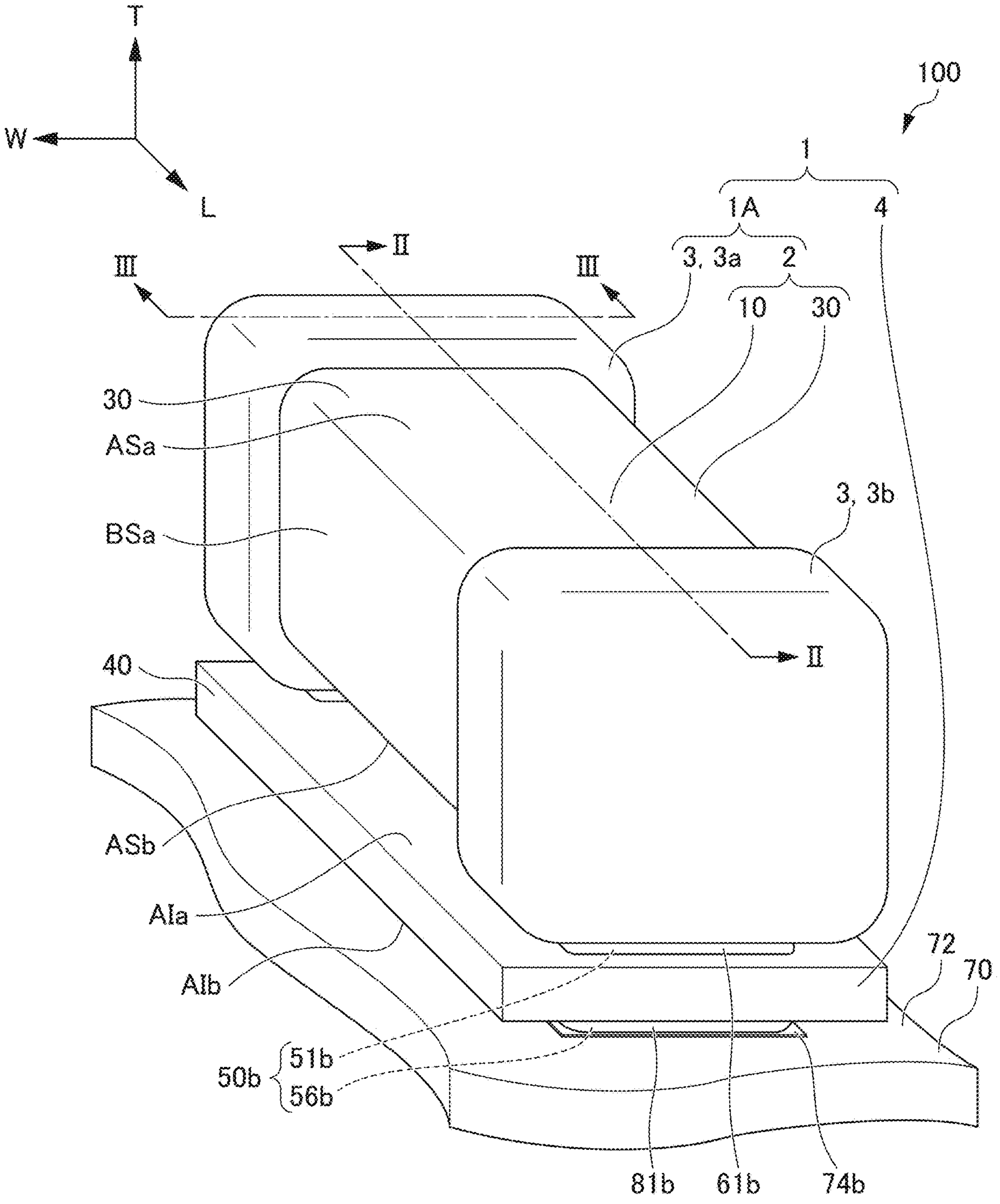
FIG. 1 is a schematic perspective view of a mounting structure for a multilayer ceramic capacitor according to an example embodiment of the present invention.
Figure 2:
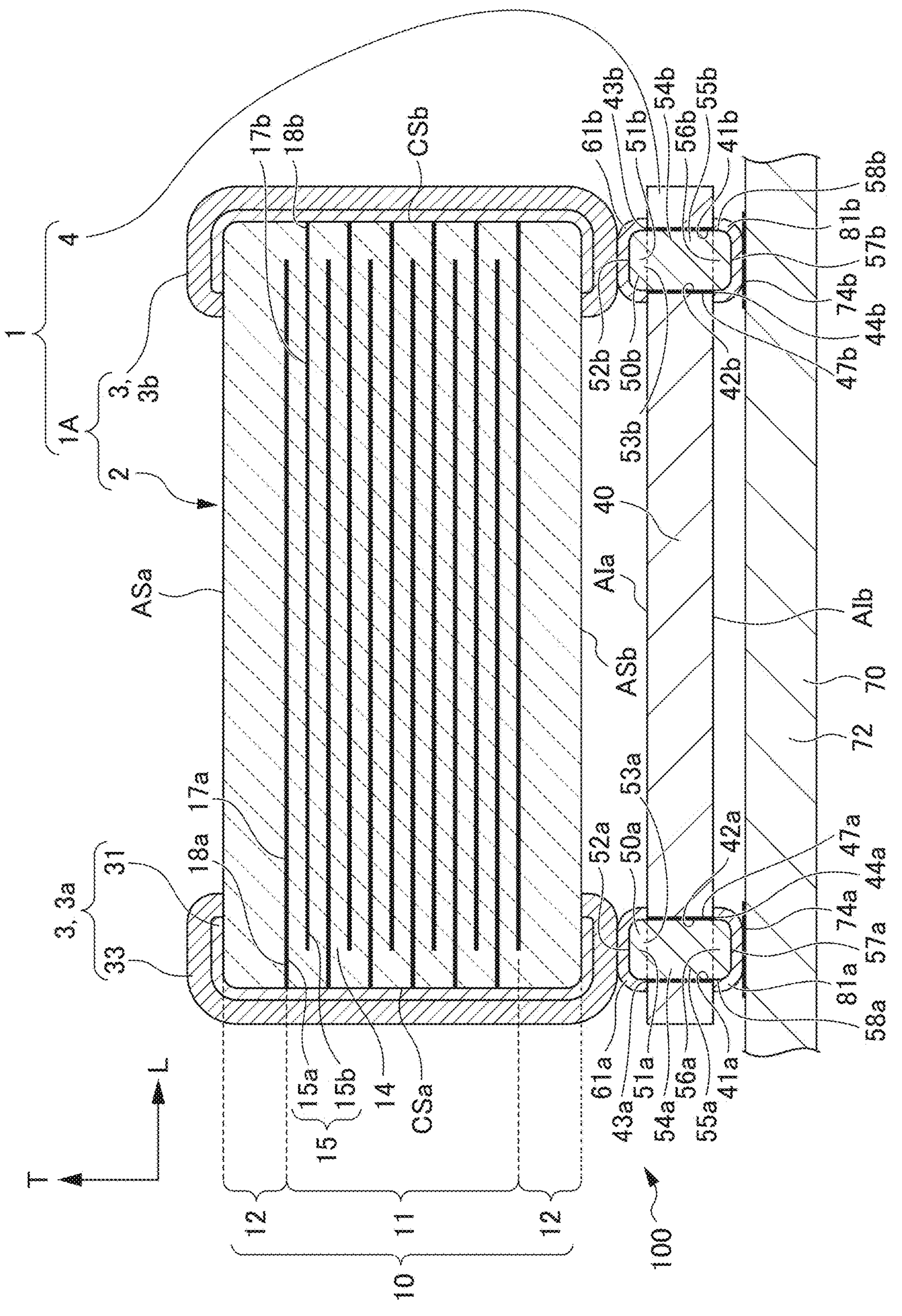
FIG. 2 is a partial cross-sectional view of a mounting structure for a multilayer ceramic capacitor according to an example embodiment of the present invention taken along the line II-II in FIG. 1.
Figure 3:
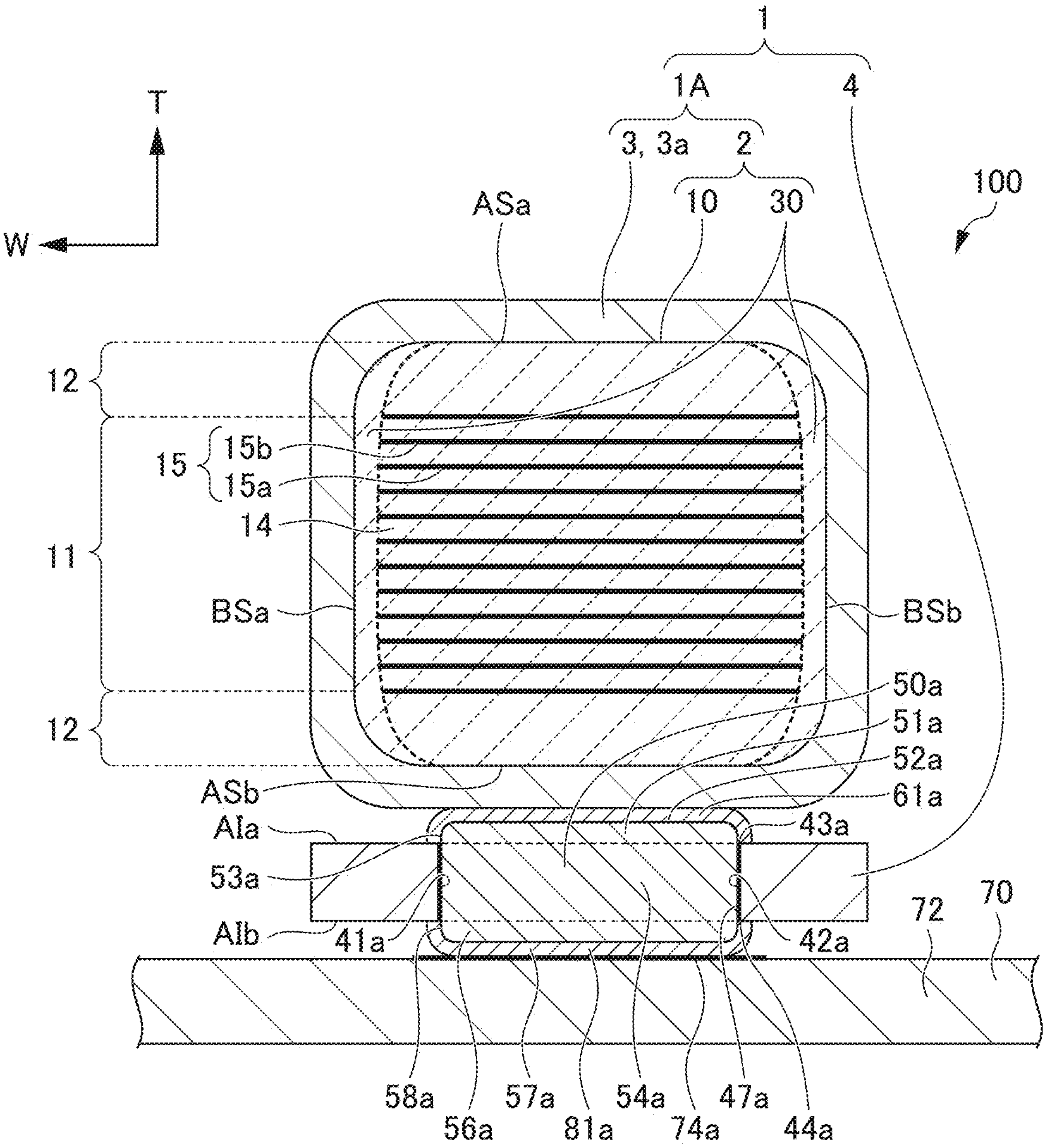
FIG. 3 is a partial cross-sectional view of a mounting structure for a multilayer ceramic capacitor according to an example embodiment of the present invention taken along the line III-III in FIG. 1.
Figure 4A:
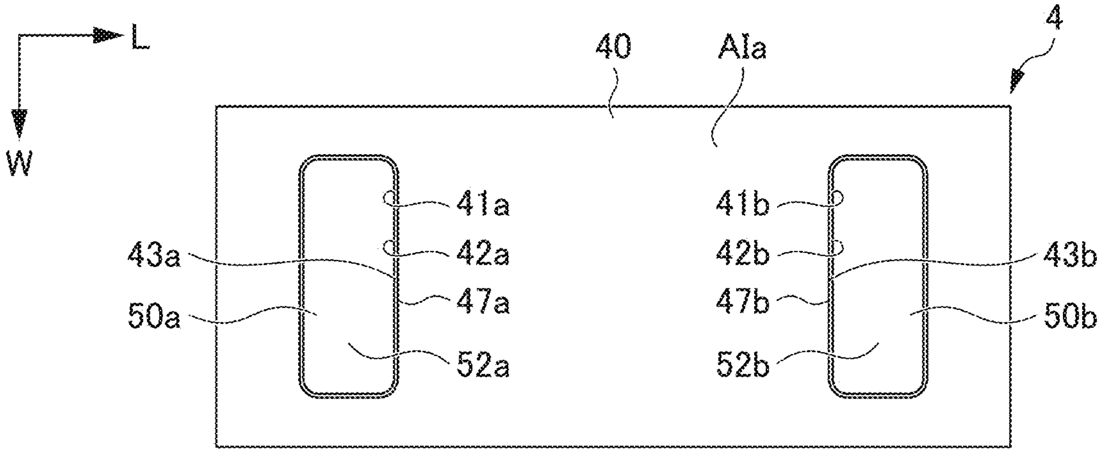
FIGS. 4A and 4B illustrate an interposer, and are a plan view of an interposer-body first main surface and a plan view of an interposer-body second main surface, respectively.
Figure 4B:
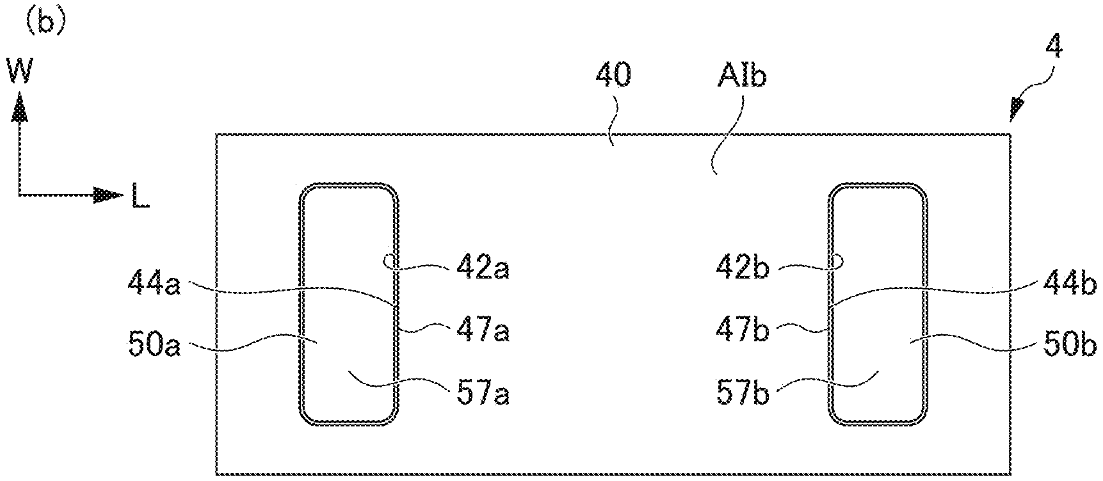

An example embodiment of the present invention will be described below with reference to FIGS. 1 to 3. FIG. 1 is a schematic perspective view of a multilayer ceramic capacitor 1 mounted on a mounting board 70. FIG. 2 is a cross-sectional view of the multilayer ceramic capacitor 1 taken along the line II-II in FIG. 1. FIG. 3 is a cross-sectional view of the multilayer ceramic capacitor 1 taken along the line III-III in FIG. 1. The line II-II passes through the center of the multilayer ceramic capacitor 1 in a width direction W, which will be described later. The line III-III passes through the center of a first external electrode 3*a* in a length direction L, which will be described later.

Multilayer Ceramic Capacitor 1

The multilayer ceramic capacitor 1 includes a capacitor body 1A and an interposer 4 attached to the capacitor body 1A.

Capacitor Body 1A

The capacitor body 1A has a rectangular or substantially rectangular parallelepiped shape, and includes a multilayer body 2, the first external electrode 3*a*, and a second external electrode 3*b*. The multilayer body 2 includes an inner layer portion 11 (to be described in detail later) including a plurality of sets of dielectric layers 14 and a plurality of sets of internal electrode layers 15 alternately laminated.

In the following description, an orientation of the multilayer ceramic capacitor 1 will be indicated using the following terms. A lamination direction T in which the dielectric layers 14 and the internal electrode layers 15 are laminated in the multilayer ceramic capacitor 1 (the inner layer portion 11), a length direction L that is one direction orthogonal or substantially orthogonal to the lamination direction T, and a width direction W that is orthogonal or substantially orthogonal to both the length direction L and the lamination direction T.

The multilayer body 2 includes a multilayer main body 10 and a pair of side gap portions 30. In the following description, among the six outer surfaces of the multilayer body 2, a pair of outer surfaces opposite to each other in the lamination direction T are referred to as a multilayer-body first main surface ASa and a multilayer-body second main surface ASb, a pair of outer surfaces opposite to each other in the width direction W are referred to as a multilayer-body first side surface BSa and a multilayer-body second side surface BSb, and a pair of outer surfaces opposite to each other in the length direction L are referred to as a multilayer-body first end surface CSa and a multilayer-body second end surface CSb. In the following, the multilayer-body first main surface ASa and the multilayer-body second main surface ASb may be collectively referred to as the "multilayer-body main surface(s) AS". The multilayer-body first side surface BSa and the multilayer-body second side surface BSb may be collectively referred to as the "multilayer-body side surface(s) BS". The multilayer-body first end surface CSa and the multilayer-body second end surface CSb may be collectively referred to as the "multilayer-body end surface(s) CS".

The dimensions of the multilayer body 2 are not particularly limited. Preferably, for example, the dimensions of the multilayer body 2 are about 0.2 mm or more and about 10 mm or less in the length direction L, about 0.1 mm or more and about 10 mm or less in the width direction W, and about 0.1 mm or more and about 5 mm or less in the lamination direction T.

The multilayer main body 10 includes the inner layer portion 11 and a pair of outer layer portions 12.

The inner layer portion 11 includes the plurality of sets of dielectric layers 14 and the plurality of sets of internal electrode layers 15 alternately laminated in the lamination direction T.

Each dielectric layer 14 has a thickness of, for example, about 0.5 μm or less. The dielectric layers 14 include a ceramic material. An example of the ceramic material is a dielectric ceramic including $BaTiO_3$ as a main component. Alternatively, the ceramic material may be a material including, in addition to the main component, at least one subcomponent, such as, for example, a Mn compound, a Fe compound, a Cr compound, a Co compound, and a Ni compound may be included.

The internal electrode layers 15 include a plurality of first internal electrode layers 15*a* and a plurality of second internal electrode layers 15*b*. The first internal electrode layers 15*a* and the second internal electrode layers 15*b* are alternately arranged. Hereinafter, the first internal electrode layers 15*a* and the second internal electrode layers 15*b* may be collectively referred to as the "internal electrode layer(s) 15".

Each first internal electrode layer 15*a* includes a first counter portion 17*a* facing the second internal electrode layer(s) 15*b*, and a first extension portion 18*a* extending from the first counter portion 17*a* to the multilayer-body first end surface CSa. One end of the first extension portion 18*a* is exposed at the multilayer-body first end surface CSa, and is conductively connected to the first external electrode 3*a*, which will be described later. Each second internal electrode layer 15*b* includes a second counter portion 17*b* facing the first internal electrode layers 15*a*, and a second extension portion 18*b* extending from the second counter portion 17*b* to the multilayer-body second end surface CSb. One end of the second extension portion 18*b* is conductively connected to the second external electrode 3*b*, which will be described later. Electric charges are accumulated between the first counter portion 17*a* of each first internal electrode layer 15*a* and the second counter portion 17*b* of each second internal electrode layer 15*b*, such that the characteristics of the capacitor are generated.

The internal electrode layers 15 preferably include a metal material representative examples of which include Ni, Cu, Ag, Pd, a Ag—Pd alloy, Au, etc. Preferably, each internal electrode layer 15 has a thickness of about 0.5 μm or more and about 2.0 mm or less, for example. The number of internal electrode layers 15 is, for example, preferably 15 or more and 200 or less in total of the first internal electrode layer 15*a* and the second internal electrode layer 15*b*.

The outer layer portions 12 sandwich the inner layer portion 11 in the lamination direction T. The outer layer portions 12 include the same material as that for the dielectric layers 14 of the inner layer portion 11. Each outer layer portion 12 has, for example, a thickness of preferably about 20 μm or less, and more preferably about 10 μm or less.

The number of dielectric layers 14 of the multilayer main body 10 is, for example, preferably 15 or more and 700 or less, inclusive of those of the outer layer portions 12.

The side gap portions 30 sandwich the multilayer main body 10 in the width direction W. The side gap portions 30 cover the ends of the internal electrode layers 15 in the width direction W that are exposed at both side surfaces of the multilayer main body 10, while extending along the ends.

The side gap portions 30 include the same material as that for the dielectric layers 14, and additionally include, for example, Mg (magnesium) as a sintering aid.

For example, each side gap portion 30 has a thickness of about 20 μm, and preferably about 10 μm or less. In the present example embodiment, each side gap portion 30 includes one layer, but this is a non-limiting example. Each side gap portion 30 may have a two-layer structure including an outer side gap layer disposed outside and an inner side gap layer disposed adjacent to the internal electrode layers 15.

The first external electrode 3*a* is disposed on the multilayer-body first end surface CSa. The first external electrode 3*a* covers the multilayer-body first end surface CSa, a portion of each of the multilayer-body main surfaces AS adjacent to the multilayer-body first end surface CSa, and a portion of each of the multilayer-body side surfaces BS adjacent to the multilayer-body first end surface CSa.

The second external electrode 3*b* is disposed on the multilayer-body second end surface CSb. The second external electrode 3*b* covers the multilayer-body second end surface CSb, a portion of each of the multilayer-body main surfaces AS adjacent to the multilayer-body second end surface CSb, and a portion of each of the multilayer-body side surfaces BS adjacent to the multilayer-body second end surface CSb.

As described above, the first external electrode 3*a* and the end of the first extension portion 18*a* of each first internal electrode layer 15*a* are conductively connected to each other. The second external electrode 3*b* and the end of the second extension portion 18*b* of each second internal electrode layer 15*b* are conductively connected to each other. Thus, a configuration in which a plurality of capacitors are electrically connected in parallel or substantially in parallel is provided between the first external electrode 3*a* and the second external electrode 3*b*.

The first external electrode 3*a* and the second external electrode 3*b* (hereinafter, may be collectively referred to as the "external electrode(s) 3") each include a base electrode layer 31 and a plated layer 33 on the base electrode layer 31. A conductive resin layer may be provided between the base electrode layer 31 and the plated layer 33.

The base electrode layer 31 is formed by, for example, applying and firing a conductive paste including a conductive metal and glass. Examples of the conductive metal for the base electrode layer 31 include Cu, Ni, Ag, Pd, a Ag—Pd alloy, Au, etc.

The plated layer 33 includes a nickel plated layer and a tin plated layer on the nickel plated layer. However, this is a non-limiting example, and the plated layer 33 preferably includes, for example, plating of one metal selected from a group including Cu, Ni, Su, Ag, Pd, a Ag—Pd alloy, and Au, or an alloy including at least one of the forgoing metals.

In a case where a conductive resin layer is provided between the base electrode layer 31 and the plated layer 33, the conductive resin layer includes a thermosetting resin and a metal component. Specific examples of the thermosetting resin include various known thermosetting resins, such as epoxy resin, phenol resin, urethane resin, silicone resin, polyimide resin, etc. As the metal component, Ag or a metal powder obtained by coating the surfaces of base metal powder with Ag can be used, for example.

Interposer 4

The interposer 4 includes a plate-shaped interposer body 40, a first pillar 50*a*, and a second pillar 50*b*. The interposer 4 is disposed adjacent to the multilayer-body second main surface ASb of the capacitor body 1A. Hereinafter, the first pillar 50*a* and the second pillar 50*b* may be collectively referred to as the "pillar (s) 50".

The interposer body 40 includes one plate-shaped material mainly made of an insulating resin. In plan view, the interposer body 40 has a rectangular or substantially rectangular shape of the same or substantially the same size as the capacitor body 1A. The interposer body 40 includes a pair of surfaces opposite to each other in the plate thickness direction, one of which is referred to as an interposer-body first main surface AIa and the other of which is referred to as an interposer-body second main surface AIb. The interposer 4 is disposed such that the interposer-body first main surface AIa faces the capacitor body 1A.

The interposer body 40 includes a first through hole 41*a* and a second through hole 41*b* that penetrate through the interposer body 40 from the interposer-body first main surface AIa to the interposer-body second main surface AIb. The first through hole 41*a* and the second through hole 41*b* (hereinafter, may be collectively referred to as the "through hole(s) 41") each include an opening with a rectangular or substantially rectangular shape in plan view of the interposer-body first main surface AIa and an opening with a rectangular or substantially rectangular shape in plan view of the interposer-body second main surface AIb. More specifically, each opening has a rectangular or substantially rectangular shape that is long in the width direction W.

A peripheral edge portion of the opening of the first through hole 41*a* on the interposer-body first main surface AIa (hereinafter, referred to as the "interposer-body first-main-surface-side opening peripheral edge portion 43*a*") is located at a position opposite to the first external electrode 3*a* in the lamination direction T. The dimension of the first through hole 41*a* in the length direction L is, for example, preferably equal to or greater than about 0.5 times the dimension of the first external electrode 3*a* in the length direction L. The dimension of the first through hole 41*a* in the length direction L is, for example, preferably equal to or less than about 1.1 times the dimension of the first external electrode 3*a* in the length direction L.

A peripheral edge portion of the opening of the second through hole 41*b* on the interposer-body first main surface AIa (hereinafter, referred to as the "interposer-body first-main-surface-side opening peripheral edge portion 43*b*") is located at a position opposite to the second external electrode 3*b* in the lamination direction T. The dimension of the second through hole 41*b* in the length direction L is, for example, preferably equal to or greater than about 0.5 times the dimension of the second external electrode 3*b* in the length direction L. The dimension of the second through hole 41*b* in the length direction L is, for example, preferably equal to or less than about 1.1 times the dimension of the second external electrode 3*b* in the length direction L.

The first pillar 50*a* is disposed in the first through hole 41*a*. The first pillar 50*a* has a quadrangular or substantially quadrangular prism shape extending in the plate thickness direction of the interposer body 40 (i.e., the lamination direction T). One end of the first pillar 50*a* in the lamination direction T is adjacent to, and protrudes from, the interposer-body first main surface AIa. The other end is adjacent to, and protrudes from, the interposer-body second main surface AIb. The portion of the first pillar 50*a* protruding from the interposer-body first main surface AIa has a dimension of, for example preferably about 100 μm or less, and more preferably about 80 μm or less in the lamination direction T. The portion of the first pillar 50*a* protruding from the interposer-body second main surface AIb has a dimension of, for example, preferably about 100 μm or less, and more preferably about 80 μm or less in the lamination direction T.

Hereinafter, a portion of the first pillar 50*a* located in the first through hole 41*a* is referred to as an insertion portion 54*a*, the portion protruding from the interposer-body first main surface AIa is referred to as an interposer-body first-main-surface-side protruding portion 51*a*, and the portion protruding from the interposer-body second main surface AIb is referred to as an interposer-body second-main-surface-side protruding portion 56*a*. The first pillar 50*a* includes a pair of surfaces opposite to each other in the lamination direction T, one of which is adjacent to the capacitor body 1A and referred to as a first-pillar first main surface 52*a*, and the other is referred to as a first-pillar second main surface 57*a*.

An outer peripheral surface 55*a* of the insertion portion 54*a* is in close contact with an inner peripheral surface 42*a* of the first through hole 41*a*. The outer peripheral surface 55*a* of the insertion portion 54*a*, a side surface 53*a* of the interposer-body first-main-surface-side protruding portion 51*a*, and a side surface 58*a* of the interposer-body second-main-surface-side protruding portion 56*a* define the same plane. That is, the shape of the first pillar 50*a* in plan view of the interposer-body first main surface AIa and in plan view of the interposer-body second main surface AIb is the same or substantially the same as the shape of the opening of the first through hole 41*a*. The first-pillar first main surface 52*a* faces the first external electrode 3*a* in the lamination direction T.

The second pillar 50*b* is disposed in the second through hole 41*b*. The second pillar 50*b* has a quadrangular or substantially quadrangular prism shape extending in the plate thickness direction of the interposer body 40 (i.e., the lamination direction T). One end of the second pillar 50*b* in the lamination direction T is adjacent to, and protrudes from, the interposer-body first main surface AIa, and the other is adjacent to, and protrudes from, the interposer-body second main surface AIb. The portion of the second pillar 50*b* protruding from the interposer-body first main surface AIa has a dimension of, for example, preferably about 100 μm or less, and more preferably about 80 μm or less in the lamination direction T. The portion of the second pillar 50*b* protruding from the interposer-body second main surface AIb has a dimension of, for example, preferably about 100 μm or less, and more preferably about 80 μm or less in the lamination direction T.

Hereinafter, a portion of the second pillar 50*b* located in the second through hole 41*b* is referred to as an insertion portion 54*b*, the portion protruding from the interposer-body first main surface AIa is referred to as an interposer-body first-main-surface-side protruding portion 51*b*, and the portion protruding from the interposer-body second main surface AIb is referred to as an interposer-body second-main-surface-side protruding portion 56*b*. The second pillar 50*b* has a pair of surfaces opposite to each other in the lamination direction T, one of which is adjacent to the capacitor body 1A and referred to as a second-pillar first main surface 52*b*, and the other is referred to as a second-pillar second main surface 57*b*.

An outer peripheral surface 55*b* of the insertion portion 54*b* is in close contact with an inner peripheral surface 42*b* of the second through hole 41*b*. The outer peripheral surface 55*b* of the insertion portion 54*b*, a side surface 53*b* of the interposer-body first-main-surface-side protruding portion 51*b*, and a side surface 58*b* of the interposer-body second main-surface-side protruding portion 56*b* define the same plane. That is, the shape of the second pillar 50*b* in plan view of the interposer-body first main surface AIa and in plan view of the interposer-body second main surface AIb is substantially the same as the shape of the opening of the second through hole 41*b*. The second-pillar first main surface 52*b* faces the second external electrode 3*b* in the lamination direction T.

The pillars 50 each include a metal material including a metal as a main component. The pillars 50 have conductivity. Examples of the metal as the main component of the metal material include Cu, Ni, etc., among which Cu is preferable. The content of Cu in the material of each pillar 50 is, for example, preferably about 60% by weight or greater, and more preferably about 70% by weight or greater. The metal has a high melting point, and specifically has a melting point of, for example, about 230° C. or higher. As the metal having a melting point of about 230° C. or higher, Au, Ni, or the like may be used instead of Cu. The phrase "including a metal as a main component" means that the proportion of the metal is 50% by weight or greater with respect to all the components of each pillar. Aside from the metal, the materials of each pillar are not particularly limited, and examples thereof include a conductive resin and the like. A metal having a melting point of about 230° C. or lower may be included.

The first pillar 50*a* and the first external electrode 3*a* are conductively connected to each other via a first conductive binder 61*a*. The first conductive binder 61*a* is, for example, solder having a melting point lower than about 230° C. The first conductive binder 61*a* can be in close contact with the first pillar 50*a* such that the first conductive binder 61*a* covers at least a portion of the interposer-body first-main-surface-side protruding portion 51*a* belonging to the first pillar 50*a*. The first conductive binder 61*a* can be in close contact with the first-pillar first main surface 52*a*, and can also be in close contact with the side surface 53*a* of the interposer-body first-main-surface-side protruding portion 51*a*.

The second pillar 50*b* and the second external electrode 3*b* are conductively connected to each other via a second conductive binder 61*b*. The second conductive binder 61*b* is, for example, solder having a melting point lower than about 230° C. The second conductive binder 61*b* can be in close contact with the second pillar 50*b* such that the second conductive binder 61*b* covers at least part of the interposer-body first-main-surface-side protruding portion 51*b* belonging to the second pillar 50*b*. The second conductive binder 61*b* can be in close contact with the second-pillar first main surface 52*b* and can also be in close contact with the side surface 53*b* of the interposer-body first-main-surface-side protruding portion 51*b*.

Mounting Structure 100

The mounting structure 100 includes the multilayer ceramic capacitor 1 and the mounting board 70 on which the multilayer ceramic capacitor 1 is mounted.

The mounting board 70 includes a flat core material 72, and a first land 74*a* and a second land 74*b* arranged on a surface of the core material 72.

The core material 72 is, for example, a glass-epoxy substrate including a material prepared by impregnating a base material that is a combination of a glass cloth and a glass nonwoven fabric with epoxy resin. The first land 74*a* and the second land 74*b* (hereinafter, may be collectively referred to as the "land(s) 74") are formed on either one or both of the surfaces of the core material 72. Each of the lands 74 is made of a metal such as, for example, Cu, Ag, Pd, and Pt, or an alloy thereof.

The first land 74*a* faces the first through hole 41*a* and the first pillar 50*a* (the first-pillar second main surface 57*a*). The first land 74*a* and the first pillar 50*a* are conductively connected to each other via a first mounting binder 81*a*. In this case, the first external electrode 3*a* and the first land 74*a* are conductively connected to each other via the first pillar 50*a*, the first conductive binder 61*a*, and the first mounting binder 81*a*.

The first mounting binder 81*a* is, for example, solder. The first mounting binder 81*a* can be in close contact with the first pillar 50*a* such that the first mounting binder 81*a* covers at least part of the interposer-body second-main-surface-side protruding portion 56*a* belonging to the first pillar 50*a*. The first mounting binder 81*a* can be in close contact with the first-pillar second main surface 57*a* and can also be in close contact with the side surface 58*a* of the interposer-body second-main-surface-side protruding portion 56*a*.

The second land 74*b* faces the second through hole 41*b* and the second pillar 50*b* (the second-pillar second main surface 57*b*). The second land 74*b* and the second pillar 50*b* are conductively connected to each other via a second mounting binder 81*b*. In this case, the second external electrode 3*b* and the second land 74*b* are conductively connected to each other via the second conductive binder 61*b*, the second pillar 50*b*, and the second mounting binder 81*b*.

The second mounting binder 81*b* is, for example, solder. The second mounting binder 81*b* can be in close contact with the second pillar 50*b* such that the second mounting binder 81*b* covers at least part of the interposer-body second-main-surface-side protruding portion 56*b* belonging to the second pillar 50*b*. The second mounting binder 81*b* can be in close contact with the second-pillar second main surface 57*b* and may also be in close contact with the side surface 58*b* of the interposer-body second-main-surface-side protruding portion 56*b* belonging to the second pillar 50*b*.

Method of Manufacturing Multilayer Ceramic Capacitor

Figure 5:
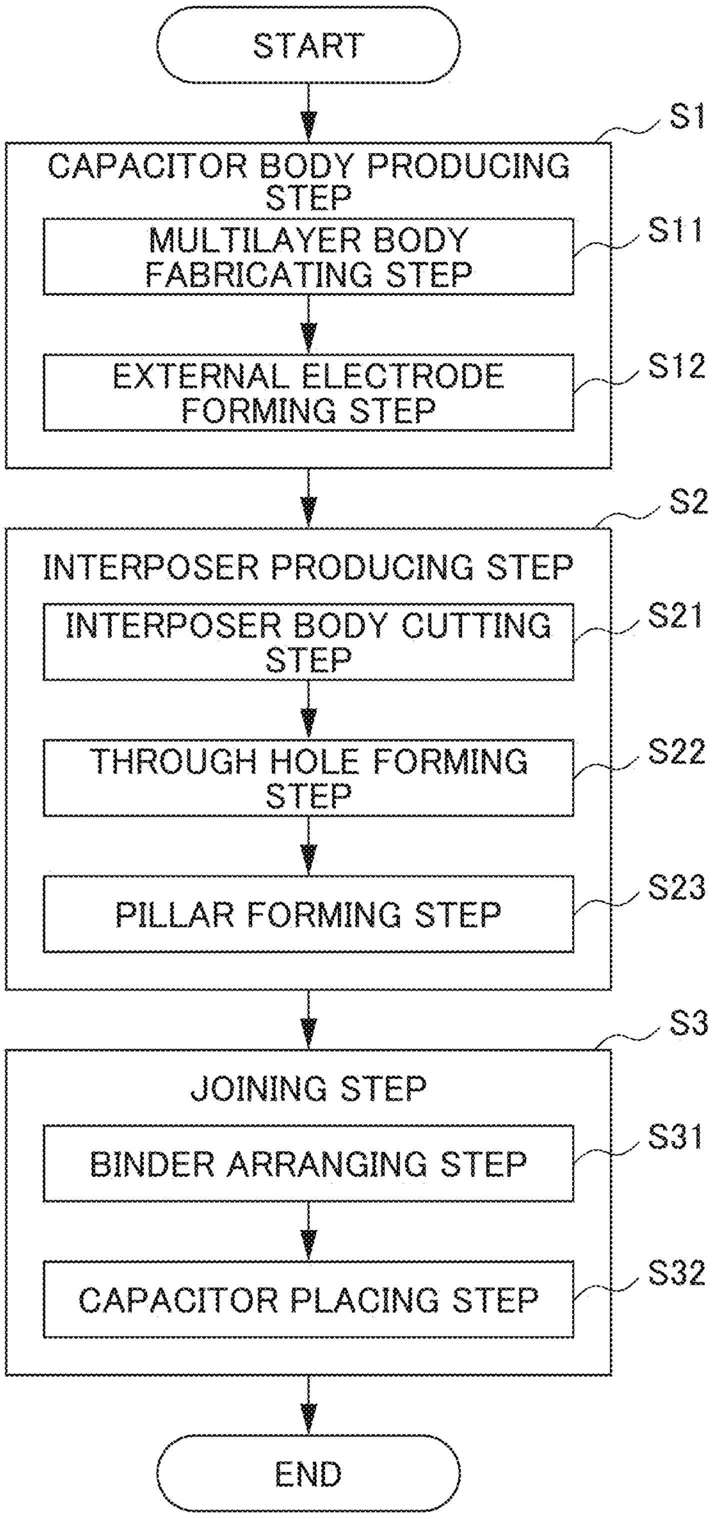
FIG. 5 is a flowchart illustrating a method of manufacturing the multilayer ceramic capacitor.

An example of a method of manufacturing the multilayer ceramic capacitor 1 will be described with reference to FIG. 5. FIG. 5 is a flowchart illustrating the method of manufacturing the multilayer ceramic capacitor 1.

The method of manufacturing the multilayer ceramic capacitor 1 includes a capacitor body producing step S1, an interposer producing step S2, and a joining step S3.

The capacitor body producing step S1 includes a multilayer body fabricating step S11 and an external electrode forming step S12.

In the multilayer body fabricating step S11, a conductive paste is printed in the patterns corresponding to the internal electrode layers 15 on green ceramic sheets for lamination, which have been prepared by forming a ceramic slurry into a sheet shape, whereby raw sheets are prepared. The plurality of raw sheets are stacked such that the internal electrode layer patterns are shifted by half pitch in the length direction between the adjacent raw sheets. Furthermore, ceramic green sheets for forming outer layer portions are staked on the top and bottom sides of the stack of the plurality of raw sheets, and are thermocompression bonded to form a mother block member. The mother block member is divided along cutting lines corresponding to the dimensions of the multilayer body, such that a plurality of multilayer chips are obtained. Thereafter, the corners and ridges of the multilayer chips may be rounded by barrel finishing or the like. Next, the multilayer chips are fired to form the multilayer bodies 2. The firing temperature depends on the material of the dielectric layers 14 and that of the internal electrode layers 15, but is, for example, preferably about 900° C. or higher and about 1400° C. or lower.

Subsequently, in the external electrode forming step S12, a base electrode layer 31 and a plated layer 33 are sequentially formed on both end surfaces of each multilayer body 2, whereby the external electrodes 3 are formed.

The interposer producing step S2 includes an interposer body forming step S21, a through hole forming step S22, and a pillar forming step S23.

In the interposer body forming step S21, a plate-shaped material mainly made of an insulating resin is cut into a desired shape to form the interposer body 40. In the present example embodiment, the interposer body 40 has a rectangular or substantially rectangular shape with the same or substantially the same size as the capacitor body 1A when viewed in the lamination direction T.

In the through hole forming step S22, the first through hole 41*a* and the second through hole 41*b* are formed in the interposer body 40. Each of the through holes 41 is formed by irradiating the interposer body 40 with a laser beam, for example. In this case, each of the through holes 41 can be formed into a desired shape.

In the pillar forming step S23, a molten metal material is poured into the through holes 41. The metal material solidifies over time. At this time, the pillars 50 having a desired shape can be obtained by changing the amount of the metal material to be poured into through holes 41 and/or changing the duration of the time for pouring the metal material. It is preferable that the inner peripheral surfaces 42*a* and 42*b* of the through holes 41 are provided with metal plating 47*a* and 47*b* in advance. Alternatively, the pillars may be formed only of metal plating.

The joining step S3 includes a binder arranging step S31 and a capacitor placing step S32.

In the binder arranging step S31, the first conductive binder 61*a* and the second conductive binder 61*b* (hereinafter, collectively referred to as the "conductive binder(s) 61") are arranged on the interposer 4. For example, cream solder as the conductive binders 61 is applied to the pillars 50 by screen printing or the like.

In the capacitor placing step S32, the capacitor body 1A is placed over the interposer 4. In this step, the first external electrode 3*a* is positioned over the first pillar 50*a* (the first-pillar first main surface 52*a*), and the second external electrode 3*b* is positioned over the second pillar 50*b* (the second-pillar first main surface 52*b*).

The multilayer ceramic capacitor 1 is manufactured by the above-described method, and thereafter, is mounted on the mounting board 70. The interposer 4 and the mounting board 70 are connected to each other via the first mounting binder 81*a* and the second mounting binder 81*b* (hereinafter, may be collectively referred to as the "mounting binder(s) 81"). At this time, the first pillar 50*a* and the first land 74*a* are connected to each other via the first mounting binder 81*a*. The second pillar 50*b* and the second land 74*b* are connected to each other via the second mounting binder 81*b*.

In general, solder (the conductive binders 61 and the mounting binders 81, which hereinafter may be collectively referred to as the "binders 61, 81") has a melting point lower than about 230° C., and accordingly, reflowing is performed at a temperature not exceeding about 230° C. Therefore, the shapes of the pillars 50 are maintained even during the reflowing.

Each of the binders 61, 81 does not necessarily have to be solder, and may be a conductive adhesive including, for example, a resin and a metal filler.

The pillars 50 only need to be conductively connected to the external electrodes 3 and the lands 74, and do not necessarily have to be connected via the binders 61, 81. For example, the pillars 50 may be directly connected to the external electrodes 3 and the lands 74. The pillars 50 may each be directly connected to one of the external electrode 3 and the land 74, and may be connected to the other via the binder 61, 81. Direct joining may be implemented by using ultrasound. Directly joining the pillars 50 to the external electrodes 3 makes it possible to avoid a situation in which a liquid binder spreads upward and wets the multilayer ceramic capacitor 1.

Advantageous Effects

The above-described example embodiment can provide the following advantageous effects.

According to the above-described example embodiment, the interposer body 40 includes the first through hole 41*a* and the second through hole 41*b* that penetrate through the interposer body 40 from the interposer-body first main surface AIa to the interposer-body second main surface AIb. The first pillar 50*a* is disposed in the first through hole 41*a*, and the second pillar 50*b* is disposed in the second through hole 41*b*. The pillars 50 protrude from the interposer-body first main surface AIa. The pillars 50 protrude from the interposer-body second main surface AIb. This configuration makes it less likely for the liquid solder (the conductive binders 61) to excessively spread upward and wet the multilayer ceramic capacitor 1 (the external electrodes 3). As a result, transmission of vibration from the capacitor body to the board can be reduced or prevented so that "acoustic noise" can be suitably prevented or reduced.

According to the above-described example embodiment, the dimension of the first through hole 41*a* in the length direction L can be set to be equal to or greater than about 0.5 times the dimension of the first external electrode 3*a* in the length direction L. The dimension of the second through hole 41*b* in the length direction L can be set to be equal to or greater than about 0.5 times the dimension of the second external electrode 3*b* in the length direction L. Setting the dimensions of the through holes 41 in the length direction L within the above range makes it possible to ensure that the pillars 50 disposed in the through holes 41 have a sufficient cross-sectional area, thus preventing equivalent series resistance (ESR) of the pillars 50 from becoming excessively high.

According to the above-described example embodiment, the dimension of the first through hole 41*a* in the length direction L can be set to be equal to or less than about 1.1 times the dimension of the first external electrode 3*a* in the length direction L. The dimension of the second through hole 41*b* in the length direction L can be set to be equal to or less than about 1.1 times the dimension of the second external electrode 3*b* in the length direction L. Setting the dimensions of the through holes 41 in the length direction L within the above range makes it possible to avoid an occurrence of a short circuit that can be caused by arranging the pillars 50 too close to each other.

In a case of increasing the amount of the solder (the conductive binders 61) between the capacitor body 1A and the interposer 4, when the multilayer ceramic capacitor 1 is mounted on the mounting board 70 (i.e., when the mounting binders 81 are reflowed), the conductive binders 61 may be re-melted, and the capacitor body 1A and the interposer 4 may be likely to be displaced from each other. Furthermore, cracks may form in the capacitor body 1A due to shrinkage of the conductive binders 61. For example, in a case where the binders 61, 81 are disposed only on the first main surfaces 52*a* and 52*b* and the second main surfaces 57*a* and 57*b* of the pillars 50, the interposer-body first-main-surface-side protruding portions 51*a* and 51*b* and the interposer-body second-main-surface-side protruding portion 56*a* and 56*b* of the pillars 50 may be likely to be damaged by external stress.

To address the above inconveniences, the portions of the pillars 50 protruding from the interposer-body first main surface AIa can be adjusted to have a dimension of about 100 μm or less in the lamination direction T in the above-described example embodiment. Furthermore, the portions of the pillars 50 protruding from the interposer-body second main surface AIb can be adjusted to have a dimension of 100 μm or less in the lamination direction T. Setting each of the portions of the pillars 50 protruding from the interposer-body first and second main surfaces AIa and AIb to have a dimension in the lamination direction T within the above range makes it possible to prevent or reduce the above-described inconvenience.

According to the above-described example embodiment, the dimension of the interposer body 40 in the lamination direction T can be set to about 30 μm or more. Setting the dimension of the interposer body 40 in the lamination direction T within the above range makes it possible to reduce transmission of vibration from the multilayer ceramic capacitor 1 to the mounting board 70. As a result, the "acoustic noise" can be effectively reduced.

Modifications

The above-described example embodiment is not intended to limit the present invention, and various modifications can be made within the scope of the present invention. In the following description of modifications, the same or corresponding components as those of the above-described example embodiment are denoted by the same reference signs.

First Modification

Figure 6A:
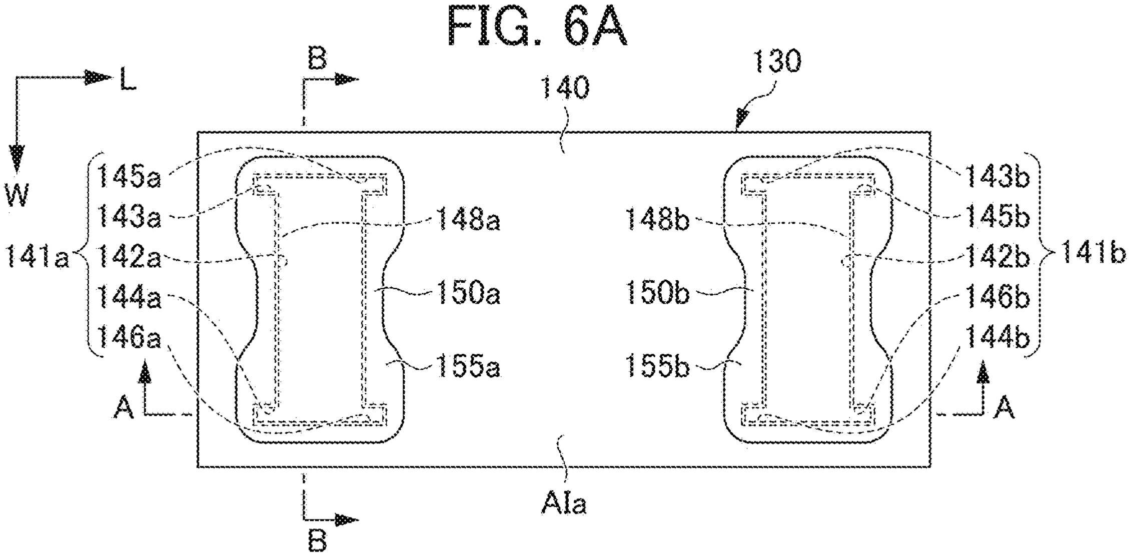
FIGS. 6A to 6D illustrate an interposer according to a first modification of an example embodiment of the present invention, where
Figure 6B:
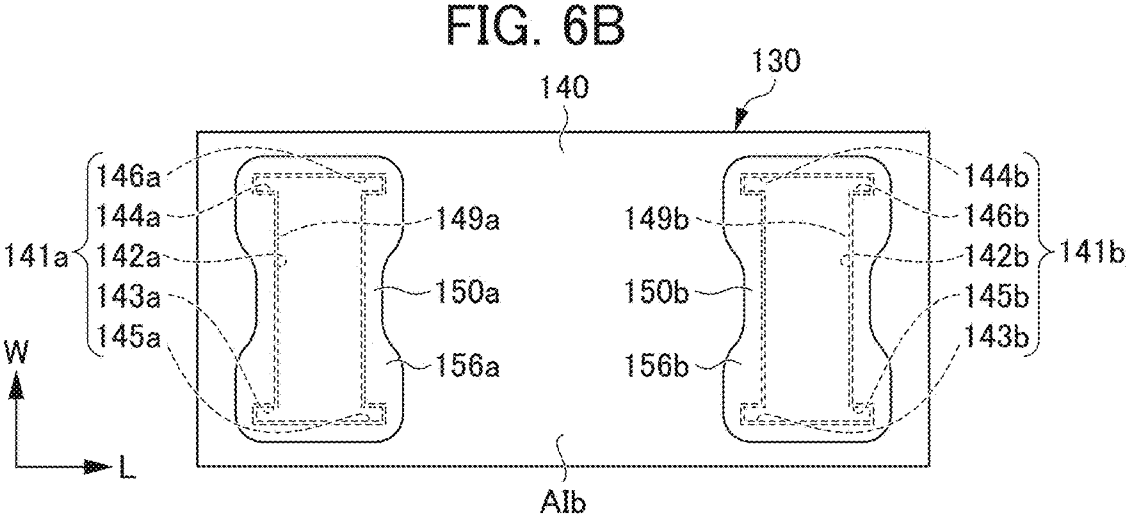
Figure 6C:
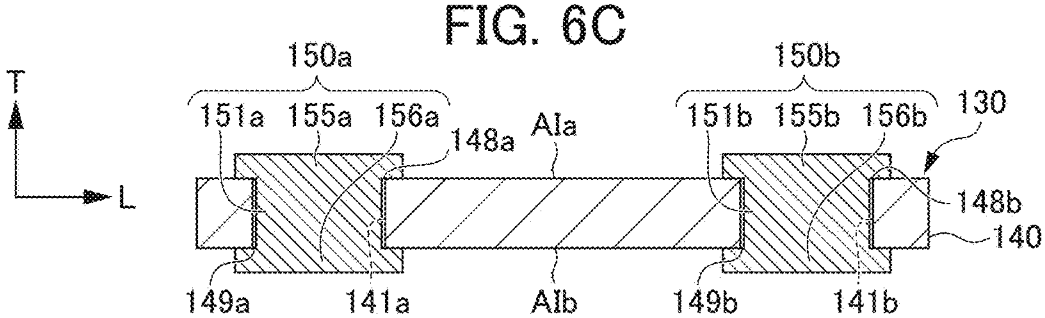
Figure 6D:
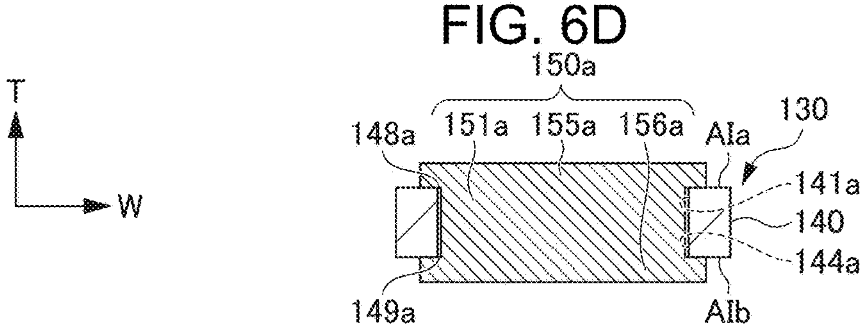

FIGS. 6A to 6D are diagrams illustrating a first modification of an example embodiment of the present invention. FIG. 6A is a plan view of an interposer-body first main surface AIa of an interposer 130 of the first modification, FIG. 6B is a plan view of an interposer-body second main surface AIb of the interposer 130, FIG. 6C is a cross-sectional view of the interposer 130, taken along the line A in FIG. 6A, and FIG. 6D is a cross-sectional view of the interposer 130, taken along the line B in FIG. 6A.

The interposer 130 of the first modification is different from the interposer of the above-described example embodiment in terms of the shape of openings of first and second through holes. An interposer body 140 according to the first modification includes a first through hole 141*a* and a second through hole 141*b*. Since the first through hole 141*a* and the second through hole 141*b* have the same or substantially the same configuration, the first through hole 141*a* will be described below as an example. In the drawings, a portion pertaining to the first through hole 141*a* and a counterpart portion pertaining to the second through hole 141*b* are denoted by a combination of a numeral with "a" and a combination of the same numeral with "b", respectively.

In the first through hole 141*a*, one main hole portion 142*a* and four sub hole portions 143*a*, 144*a*, 145*a* and 146*a* are provided. The main hole portion 142*a* and the sub hole portions 143*a*, 144*a*, 145*a*, and 146*a* are continuous with each other, such that the main hole portion 142*a* and the sub hole portions 143*a*, 144*a*, 145*a*, and 146*a* together form the first through hole 141*a* as one hole.

The opening of the main hole portion 142*a* has a rectangular or substantially rectangular shape that extends in the width direction W. The opening of each of the four sub hole portions 143*a*, 144*a*, 145*a*, and 146*a* has a rectangular or substantially rectangular shape that extends in the length direction L. The four sub hole portions 143*a*, 144*a*, 145*a*, and 146*a* have the same or substantially the same opening area that is smaller than the opening area of the main hole portion 142*a*. When viewed in the lamination direction T, from among the four sub hole portions 143*a*, 144*a*, 145*a*, and 146*a*, two sub hole portions 143*a* and 144*a* are located along one of sides of the main hole portion 142*a* that are opposite to each other in the length direction L, and more specifically, are located at both ends of the one side of the main hole portion 142*a* in the width direction W. From among the four sub hole portions 143*a*, 144*a*, 145*a*, and 146*a*, the other two sub hole portions 145*a* and 146*a* are located at positions symmetrical to the sub hole portions 143*a* and 144*a* with respect to the main hole portion 142*a*, which is interposed in the length direction L.

As can be seen, the openings of the through holes are not limited to a particular shape. The openings of the through holes may be, for example, circular or substantially circular, instead of the above-described shape. However, the dimension of each through hole in the length direction L is, for example, preferably about 0.5 times or more and about 1.1 times or less the dimension of each external electrode in the length direction L.

Additionally, the first modification is different from the above-described example embodiment in terms of the shapes of the first pillar and the second pillar. The interposer 130 of the first modification includes a first pillar 150*a* and a second pillar 150*b*. The first pillar 150*a* and the second pillar 150*b* have the same or substantially the same shape. In the following, the first pillar 150*a* will be described as an example. In the drawings, a portion pertaining to the first pillar 150*a* and a counterpart portion pertaining to the second pillar 150*b* are denoted by a combination of a numeral with "a" and a combination of the same numeral with "b", respectively.

The first pillar 150*a* includes an insertion portion 151*a* located in the first through hole 141*a*, an interposer-body first-main-surface-side protruding portion 155*a* protruding from the interposer-body first main surface AIa, and an interposer-body second-main-surface-side protruding portion 156*a* protruding from the interposer-body second main surface AIb.

The insertion portion 151*a* has the same or substantially the same shape as the interior space of the first through hole 141*a*. In plan view of the interposer-body first main surface AIa, the interposer-body first-main-surface-side protruding portion 155*a* covers an interposer-body first-main-surface-side opening peripheral edge portion 148*a* of the first through hole 141*a*, and specifically, covers the entirety or substantially the entirety of the interposer-body first-main-surface-side opening peripheral edge portion 148*a* of the first through hole 41*a*. This configuration makes it possible to reduce or prevent positional displacement of the first pillar 150*a* in the lamination direction T.

In plan view of the interposer-body second main surface AIb, the interposer-body second-main-surface-side protruding portion 156*a* covers an interposer-body second-main-surface-side opening peripheral edge portion 149*a* of the first through hole 141*a*, and specifically, covers the entirety or substantially the entirety of the interposer-body second-main-surface-side opening peripheral edge portion 149*a* of the first through hole 141*a*. This configuration makes it possible to more reliably reduce or prevent positional displacement of the first pillar 150*a* in the lamination direction T.

It is possible to provide a configuration in which only one of following is achieved: the state in which the interposer-body first-main-surface-side protruding portion 155*a* covers the interposer-body first-main-surface-side opening peripheral edge portion 148*a* of the first through hole 141*a* in plan view of the interposer-body first main surface AIa, or the state in which the interposer-body second-main-surface-side protruding portion 156*a* covers the interposer-body second-main-surface-side opening peripheral edge portion 149*a* of the first through hole 141*a* in plan view of the interposer-body second main surface AIb.

The interposer-body first-main-surface-side protruding portion 155*a* does not necessarily have to cover the entirety of the interposer-body first-main-surface-side opening peripheral edge portion 148*a* of the first through hole 141*a* in plan view of the interposer-body first main surface AIa, and may cover only a portion of the interposer-body first-main-surface-side opening peripheral edge portion 148*a*. The interposer-body second-main-surface-side protruding portion 156*a* does not necessarily have to cover the entirety of the interposer-body second-main-surface-side opening peripheral edge portion 149*a* of the first through hole 141*a* in plan view of the interposer-body second main surface AIb, and may cover only a portion of the interposer-body second-main-surface-side opening peripheral edge portion 149*a*. These configurations also make it possible to reduce or prevent positional displacement of the first pillar 150*a* in the lamination direction T.

Second Modification

Figure 7A:
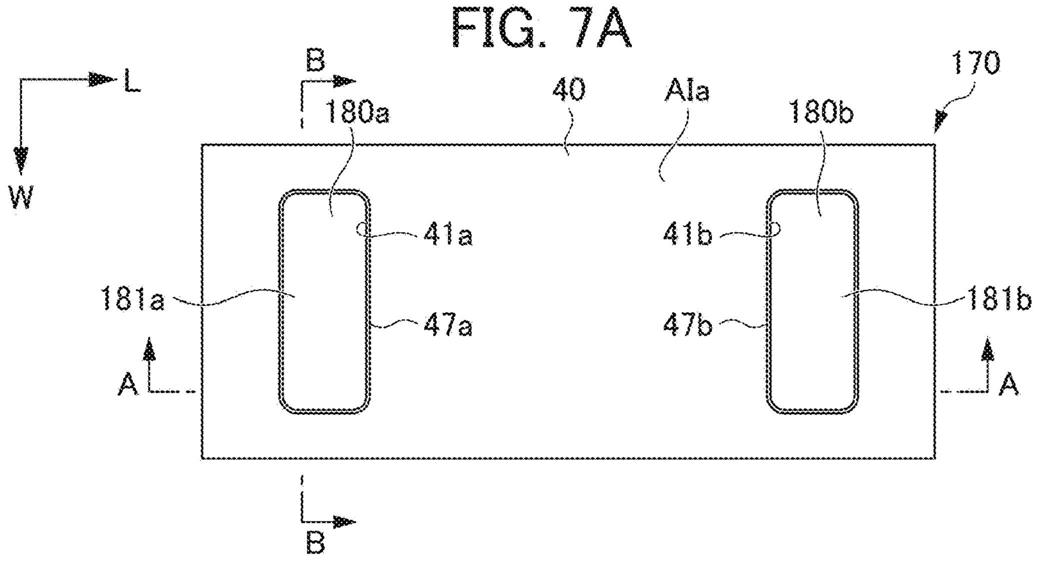
FIGS. 7A to 7D illustrate an interposer according to a second modification of an example embodiment of the present invention, where
Figure 7B:
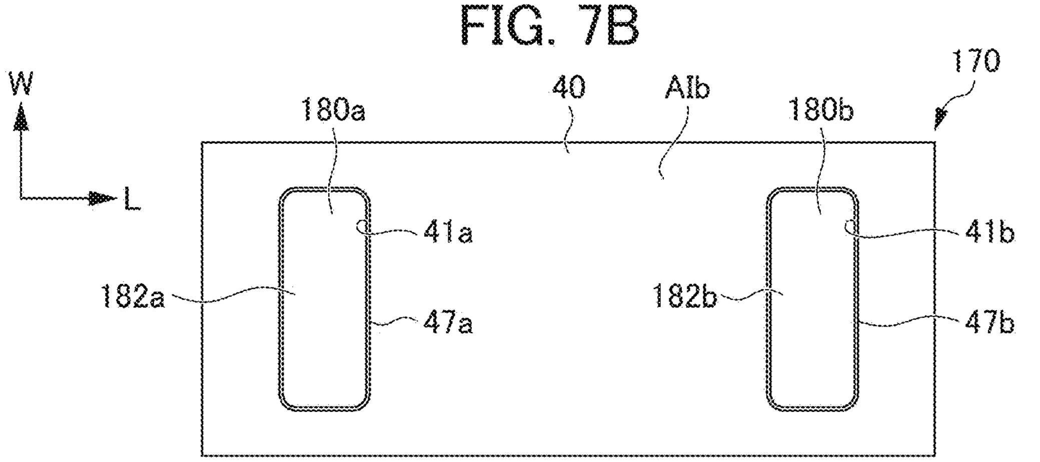
Figure 7C:
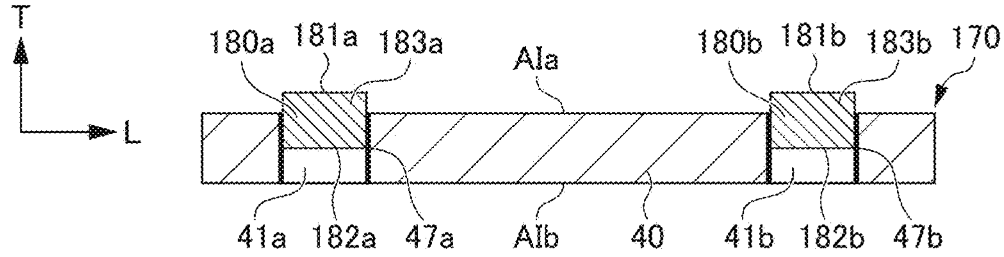
Figure 7D:
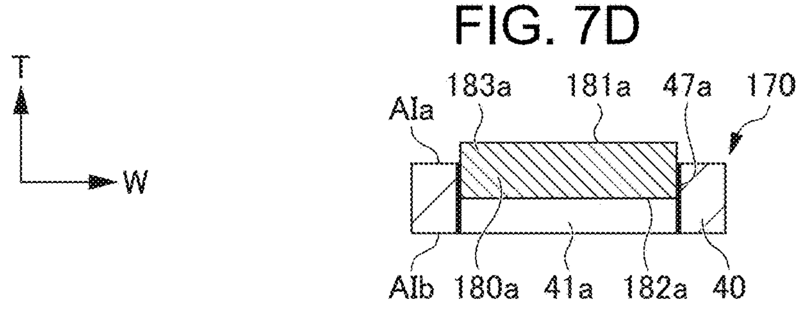

FIGS. 7A to 7D are diagrams illustrating a second modification of an example embodiment of the present invention. FIG. 7A is a plan view of an interposer-body first main surface AIa of an interposer 170 of the second modification, FIG. 7B is a plan view of an interposer-body second main surface AIb of the interposer 170, FIG. 7C is a cross-sectional view of the interposer 170, taken along the line A in FIG. 7A, and FIG. 7D is a cross-sectional view of the interposer 170, taken along the line B in FIG. 7A.

The second modification is different from the above-described example embodiment in terms of the dimension of the first and second pillars in the lamination direction T. The interposer 170 according to the second modification includes a first pillar 180*a* and a second pillar 180*b*. Since the first pillar 180*a* and the second pillar 180*b* have the same or substantially the same configuration, the first pillar 180*a* will be described below as an example. In the drawings, a portion pertaining to the first pillar 180*a* and a counterpart portion pertaining to the second pillar 180*b* are denoted by a combination of a numeral with "a" and a combination of the same numeral with "b", respectively.

The first pillar 180*a* includes a first-pillar first main surface 181*a* and a first-pillar second main surface 182*a*.

The first-pillar first main surface 181*a* of the first pillar 180*a* protrudes from the interposer-body first main surface AIa. In other words, the first pillar 180*a* includes an interposer-body first-main-surface-side protruding portion 183*a*.

The first-pillar second main surface 182*a* is located in the first through hole 41*a*.

The first through hole 41*a* includes an inner peripheral surface 42*a* coated with metal plating 47*a* that has wettability with respect to the first mounting binder 81*a*. Thus, the first mounting binder 81*a* can be introduced into the first through hole 41*a*. Consequently, the first mounting binder 81*a* and the first pillar 180*a* (more specifically, the first-pillar second main surface 182*a*) can be brought into close contact with each other. The metal plating 47*a* is formed by, for example, electroless plating or the like.

As can be seen, the first pillar does not necessarily have to include both ends in the lamination direction T protruding from the interposer body (first through hole). However, in the configuration of the second modification, only the first-pillar second main surface 182*a* of the first pillar 180*a* is in close contact with the first mounting binder 81*a*. It is preferable that both ends of the first pillar in the lamination direction T protrude from the interposer body because this causes the first pillar to be more firmly connected to the first conductive binder (or the first external electrode) and the first mounting binder (or the first land).

The first-pillar second main surface 182*a* may be flush with the interposer-body second main surface AIb. The first pillar 180*a* may be disposed such that the first-pillar second main surface 182*a* protrudes from the interposer-body second main surface AIb and the first-pillar first main surface 181*a* is located in the first through hole 41*a* (or is flush with the interposer-body first main surface AIa). In other words, it is sufficient that at least one of the ends of the first pillar in the lamination direction T protrudes from the interposer body, and in this case, the position of the other end is not particularly limited.

It should be noted that the present invention is not limited to the above-described example embodiment and modifications.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic capacitor comprising:
- a capacitor body including a multilayer body, a first external electrode, and a second external electrode; and
- an interposer; wherein
- the first external electrode is provided on the multilayer-body;
- the second external electrode is provided on the multilayer-body;
- the interposer includes an interposer body, a first pillar, and a second pillar;
- the first pillar is disposed in a first through hole, protrudes from the interposer, and is connected to the first external electrode by a conductive material;
- the second pillar is disposed in a second through hole, protrudes from the interposer, and is connected to the second external electrode by a conductive material;
- the first pillar and the second pillar are copper plated;
- the first pillar is substantially H-shaped and covers an opening peripheral edge portion of the first through hole when viewed in a thickness direction of the interposer; and
- the second pillar is substantially H-shaped and covers an opening peripheral edge portion of the second through hole when viewed in the thickness direction of the interposer.

2. The multilayer ceramic capacitor according to claim 1, wherein
- in a length direction orthogonal or substantially orthogonal to the thickness direction, a dimension of the first through hole is equal to or greater than about 0.5 times a dimension of the first external electrode; and
- a dimension of the second through hole in the length direction is equal to or greater than about 0.5 times a dimension of the second external electrode in the length direction.

3. The multilayer ceramic capacitor according to claim 1, wherein
- in a length direction orthogonal or substantially orthogonal to the thickness direction, a dimension of the first through hole is equal to or less than about 1.1 times a dimension of the first external electrode; and
- a dimension of the second through hole in the length direction is equal to or less than about 1.1 times a dimension of the second external electrode in the length direction.

4. The multilayer ceramic capacitor according to claim 1, wherein
- the first pillar includes a first portion protruding from the interposer and having a dimension of about 100 μm or less in the thickness direction;
- the first pillar includes a second portion protruding from the interposer and having a dimension of about 100 μm or less in the thickness direction;
- the second pillar includes a first portion protruding from the interposer and having a dimension of about 100 μm or less in the thickness direction; and
- the second pillar includes a second portion protruding from the interposer and having a dimension of about 100 μm or less in the thickness direction.

5. The multilayer ceramic capacitor according to claim 1, wherein the interposer body has a dimension of about 30 μm or more in the thickness direction.

6. The multilayer ceramic capacitor according to claim 1, wherein the interposer body has a dimension of about 300 μm or less in the thickness direction.

7. A mounting structure for a multilayer ceramic capacitor, the mounting structure comprising:

the multilayer ceramic capacitor according to claim 1; and a mounting board including a first land and a second land; wherein the mounting board being positioned such that the interposer is sandwiched between the mounting board and the capacitor body;

the first land is conductively connected to the first pillar; and the second land is conductively connected to the second pillar.

8. The mounting structure according to claim 7, wherein in a length direction orthogonal or substantially orthogonal to the thickness direction, a dimension of the first through hole is equal to or greater than about 0.5 times a dimension of the first external electrode; and a dimension of the second through hole in the length direction is equal to or greater than about 0.5 times a dimension of the second external electrode in the length direction.

9. The mounting structure according to claim 7, wherein in a length direction orthogonal or substantially orthogonal to the thickness direction, a dimension of the first through hole is equal to or less than about 1.1 times a dimension of the first external electrode; and a dimension of the second through hole in the length direction is equal to or less than about 1.1 times a dimension of the second external electrode in the length direction.

10. The mounting structure according to claim 7, wherein the first pillar includes a first portion protruding from the interposer and having a dimension of about 100 μm or less in the thickness direction;

the first pillar includes a second portion protruding from the interposer and having a dimension of about 100 μm or less in the thickness direction;

the second pillar includes a first portion protruding from the interposer and having a dimension of about 100 μm or less in the thickness direction; and the second pillar includes a second portion protruding from the interposer and having a dimension of about 100 μm or less in the thickness direction.

11. The mounting structure according to claim 7, wherein the interposer body has a dimension of about 30 μm or more in the thickness direction.

12. The mounting structure according to claim 7, wherein the interposer body has a dimension of about 300 μm or less in the thickness lamination direction.

* * * * *